United States Patent [19]
Kaminar et al.

[11] Patent Number: 6,020,554
[45] Date of Patent: Feb. 1, 2000

[54] TRACKING SOLAR ENERGY CONVERSION UNIT ADAPTED FOR FIELD ASSEMBLY

[75] Inventors: Neil R. Kaminar, Boulder Creek, Calif.; James G. Ross, III, Bothell, Wash.; Peter J. Carrie, Toronto, Canada

[73] Assignee: Photovoltaics International, LLC, Sunnyvale, Calif.

[21] Appl. No.: 09/273,083

[22] Filed: Mar. 19, 1999

[51] Int. Cl.[7] .......................... H01L 31/0232; F29J 2/08; G02B 3/08
[52] U.S. Cl. .......................... 136/246; 136/246; 136/259; 126/698; 359/726; 359/742
[58] Field of Search .................................... 136/244, 246, 136/259, 247, 243; 126/573, 698; 359/726, 742

[56] References Cited

U.S. PATENT DOCUMENTS

| | | | |
|---|---|---|---|
| 3,841,732 | 10/1974 | Marks | 350/160 |
| 4,069,812 | 1/1978 | O'Neill | 126/271 |
| 4,307,710 | 12/1981 | Natter | 126/440 |
| 4,715,358 | 12/1987 | Koster | 126/439 |
| 4,723,535 | 2/1988 | Lew | 126/439 |
| 4,964,713 | 10/1990 | Goetzberger | 350/629 |
| 5,255,666 | 10/1993 | Curchod | 126/569 |
| 5,286,305 | 2/1994 | Laing et al. | 136/246 |
| 5,498,297 | 3/1996 | O'Neill et al. | 136/246 |
| 5,596,981 | 1/1997 | Soucy | 126/704 |
| 5,665,174 | 9/1997 | Laing et al. | 136/246 |
| 5,691,542 | 11/1997 | Bates et al. | 250/495.1 |
| 5,735,262 | 4/1998 | Houtman | 126/649 |

*Primary Examiner*—Nam Nguyen
*Assistant Examiner*—Michael C. Miggins
*Attorney, Agent, or Firm*—Thomas Schneck

[57] ABSTRACT

A modular solar energy collector having elongated V-shaped side walls formed by a pair of coplanar panels for each side wall. The upper panels, occupying most of the wall area are diffusely reflective, but the lower panels are specularly reflective. A Fresnel lens, having a snap fit relation to the side walls focuses some light on the lower specularly reflective panels which direct light to the solar cells at the base of the V-shaped walls. A heat sink provides support for the two panels with two opposed, upwardly extending wings terminating in opposed linear clips located near the lengthwise seam of the coplanar panels, each clip holding two coplanar panels in parallel alignment. The clips not only provide support for the panels, but also transfer heat to the remainder of the heat sink. The clips are shaped so that edges of the panels engage each clip by a snap fit, outside of the clip in one embodiment and inside of the clip in another embodiment. End caps are also formed with structures which snap to the wall panels. Since all junctions of components snap together, the collector of the present invention is easily assembled without specialized tools. Using side walls which are only partly specularly reflective permits a large angle of acceptance, yet provides an economical wall design because the entire wall need not be specularly reflective.

23 Claims, 5 Drawing Sheets

TRACKING SOLAR ENERGY CONVERSION UNIT ADAPTED FOR FIELD ASSEMBLY

TECHNICAL FIELD

The invention relates to a tracking, modular solar energy conversion unit that is able to be easily assembled in the field and, more particularly, to an improved solar collector construction for such a unit.

BACKGROUND ART

Solar energy conversion units convert solar energy into other forms of energy that can be used, such as thermal energy or electrical energy. The solar energy conversion units of the prior art are typically assembled in a distant factory or are assembled in a temporary factory that is set up near the site where the solar units are intended to be installed. Such a solar energy conversion system of the prior art is exemplified by U.S. Pat. No. 5,255,666 to D. Curchod, which describes a tracking solar electric conversion unit and system featuring substantially increased efficiency with reduced losses and increased acceptance angles. On the other hand, U.S. Pat. No. 5,596,981 to P. Soucy, describes a non-tracking solar collector that can be on-site fabricated and adapted for single or multiple installations in original or retrofit applications in a building with minimal structural modification.

Since typical solar energy conversion units are fairly large, high shipping costs can be incurred in shipping completed units from the factory to the installation site. Setting up temporary factory sites near the installation can save shipping costs, but this savings may be offset by the cost of setting up the temporary factory. Additionally, since the prior art assemblies require a large amount of parts for securement, such as screws, pop-rivets, and other fastening devices, there is a labor cost involved in fastening all of the devices, as well as the cost of training skilled factory workers to assemble the units.

It is the object of the present invention to provide a modular solar energy conversion unit that is designed to be easily assembled in the field. It is a further object to provide a modular solar energy conversion unit that will save costs incurred in shipping, labor and parts.

SUMMARY OF THE INVENTION

The above objects have been met by a tracking, modular solar energy conversion unit that features a new collector wall member construction with snap-together joints for ease of assembly in a pivoting unit which allows solar tracking. Two convergent wall members are each formed of two parallel, coplanar, passive, panels, including an upper diffusely reflective panel, forming more than half the height of a wall member and a lower specularly reflective panel. The term "passive" means that the wall panels are not, for example, cells, which are active members. The lower, specularly reflective, panel is large enough to redirect light towards photovoltaic cells, i.e. provide the solar energy conversion unit with a large acceptance angle, but small enough to be economically fabricated. Both panels are held parallel in a single plane by linear clips at the extremities of opposed upwardly extending wings of a heat sink which forms a support for the wall panels. The term "linear" in "linear clips" means that the clip has a longitudinal extent running along the length of the upper and lower panels. The clips are double joints which allow snap together joinder of the two panel members with the heat sink, forming each of the two wall members. Each panel has a folded ridge which snaps into a clip. The solar energy conversion unit includes a Fresnel lens spanning the convergent wall members of the collector. The wall members extend downward and towards each other in a V-shape, with the lens at the top of the V-shape and the receiver, complete with cells and a heat sink at the bottom.

A pair of end caps snap to the outer edges of the wall members, forming a closure for the housing. The heat sink carries a plurality of photovoltaic cells, facing the Fresnel lens, that convert the solar energy into electrical energy. The heat sink also transfers heat away from the photovoltaic cells in order to maintain a proper operating temperatures for the cells. The connections or joints between the heat sink and the wall members and between the lens and the wall members are made by snap-fit structures that are designed to fit together without the use of a tool. The heat sink may have snap-on heat exchanger fins of various lengths and geometries in order to optimize heat transfer and material use.

The ability to field assemble the solar energy conversion unit would allow a considerable savings in shipping costs and in factory assembly costs. The parts can be shipped in a dense packing configuration to the site and assembly can be accomplished using on-site labor. Additionally, the use of snap-together structures minimizes the number of fastening parts that need to be used and minimizes the time and effort needed to assemble the unit.

BEST MODE FOR CARRYING OUT THE INVENTION

Figure 1:
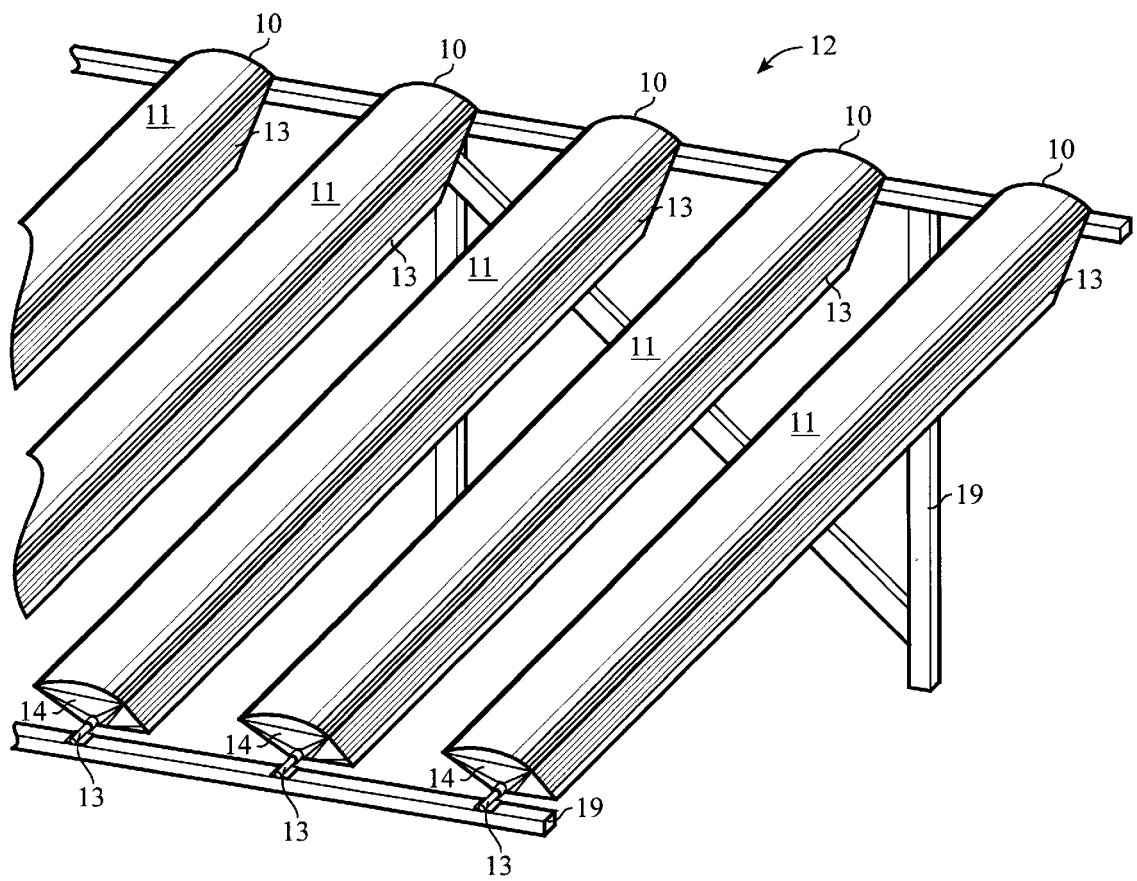
FIG. 1 is a perspective view of a modular solar electric conversion assembly of the present invention.

Referring to FIG. 1, the modular solar energy conversion assembly 12 consists of a plurality of solar concentrator units 10 mounted on a frame 19. The frame 19 is arranged such that the units 10 are aligned at a angle so as to be directly facing the source of radiant energy, typically solar energy. The units are mounted to the frames by shafts 13 and associated bearings or sleeves so that the units can track the sun. Any type of tracking unit could be used. For example, a conventional solar energy sensor, not shown, senses the solar direction and provides a signal to a controller for a motor for pointing the collectors in the proper energy flux direction. Either single or dual axis tracking could be used.

While three units are shown forming the assembly, the number of units is arbitrary. Each solar energy conversion unit 10 includes a concentrator lens 11, a passive collector 13 and an active cell area, not shown. The concentrator lens is a curved, elongated extruded Fresnel lens 11 which is attached to sidewalls of the collector by a snap fit. The Fresnel lens is constructed with facets or stepped setbacks so as to provide a thin lens having the optical properties of a much thicker lens. The lens is extruded of a polymeric material, preferably acrylic. The image plane of the lens is designed to generally coincide with an active area of solar cells which produce output current in response to light flux upon the cells. End caps 14 are secured on opposite ends of the solar concentrator unit 10 in order to complete the enclosure of the unit 10.

Figure 2:
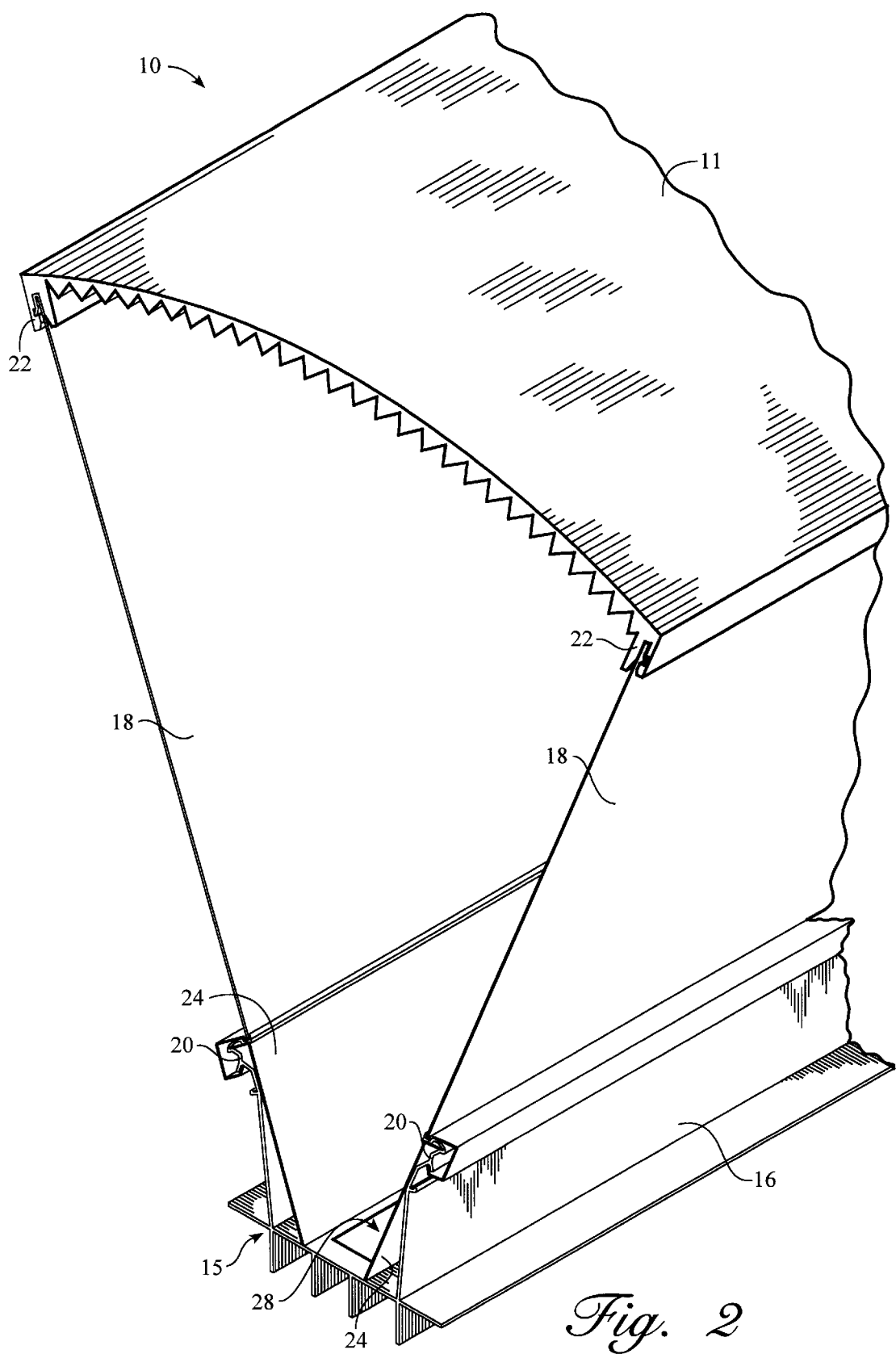
FIG. 2 is a perspective view of an end of a solar electric conversion unit shown in FIG. 1 with the end cap removed.

In FIG. 2 a solar concentrator unit 10 of the present invention has its end caps removed. The lens 11 is connected to the upper wall panels 18 by a pair of snap-fit upper joints 22, consisting of fork-like tangs which engage both sides of the rim of opposing walls. The upper wall panels 18 extend downward from the lens 11 converging toward each other at an angle. The bottom edges of the upper wall panels 18 are connected to linear clips forming a unique lower joint at the ends of opposed wings 16 of an aluminum heat sink, described below. Also connected to the clips are specularly reflective lower panels 24, as part of the sidewall, designed to capture light from the lens on the first impingement upon a surface and direct such light onto the active surface, i.e. solar cells. Such a specularly reflective surface accommodates tracking errors or lens deformation where cones of incoming light exceed the width of the active area. On the one hand, one could make the entire sidewall area specularly reflective, but this would be at significant expense. On the other hand, one could make the entire sidewall area diffusely reflective, but this would result in loss of light at the active area. The present approach of splitting the sidewall area, allows for efficient capture of light, but with construction economies.

Clip joints 20 are formed as the uppermost part of the opposed upright wings 16 of the heat sink 15 and serve as double joints. On the one hand, the clip joints 20 connect the upper wall panels 18 to the heat sink 16. On the other hand, the clip joints 20 also connect lower reflector panels 24 to the wings 16 so that the upper wall panels and the lower reflector panels lie in the same plane. Both panels are sheet metal having edges to engage the clip joints 20, as described below.

An array of photovoltaic cells 28 are arranged on a horizontal surface on the base of the heat sink 15, the photovoltaic cells 28 facing upwards and opposing the lens 11. The cells are laid flat on the heat sink base. The cells are photo-electrically active diodes which are placed over an insulating substrate and then coated with a clear, protective overcoat which is non-reactive to UV light. The photovoltaic cells 28 receive the solar light through the lens 11, as well as from the passive collector, and generate current at an electrical potential to produce useful electrical energy. The heat sink 15 with a base, and outwardly extending upright wings functions to transfer heat away from the photovoltaic cells 28 in order to maintain a proper operating temperature for the photovoltaic cells.

A pair of specularly reflective panels 24 are supported from inside of the wings 16 of heat sink 15 at an angle between the wings of the heat sink and the base of the heat sink, so that the walls form a V-shape. The lower panels 24 are made specularly reflective in order to direct and concentrate the solar energy onto the photovoltaic cells 28. The lower panels may have a sputtered or vapor deposited coating over metal, preferably aluminum, to become specularly reflective. The lower wall panels may lie within the focal zone of lens 11, either by lens design or lens deformation, or collector misalignment, and so the specular reflectivity of the lower panels causes light rays falling on the lower wall panels to be redirected to the photovoltaic cells. On the other hand, the upper wall panels, which are not specularly reflective are mostly outside of the focal zone of the lens and so do not need to be specularly reflective. The size of the lower panel partly depends upon the size of the tracking error to be accommodated. The larger the tracking error, the larger the panel. In general, the lower panels are considerably smaller than the upper panels since the lower panels are more expensive to fabricate.

Figure 3:
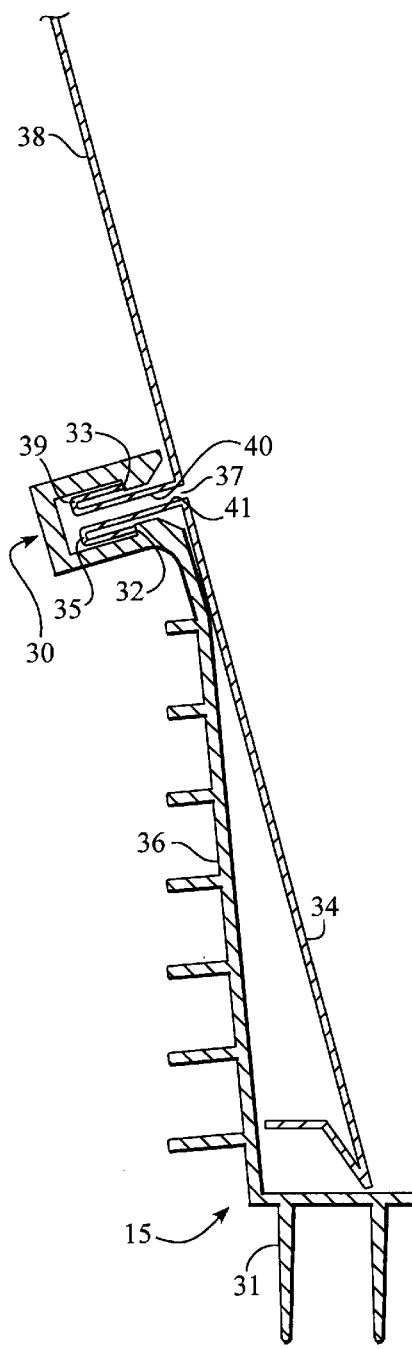
FIG. 3 is a side view of a first embodiment of a heat sink and wall member connection joint in accordance with the present invention.
Figure 4:
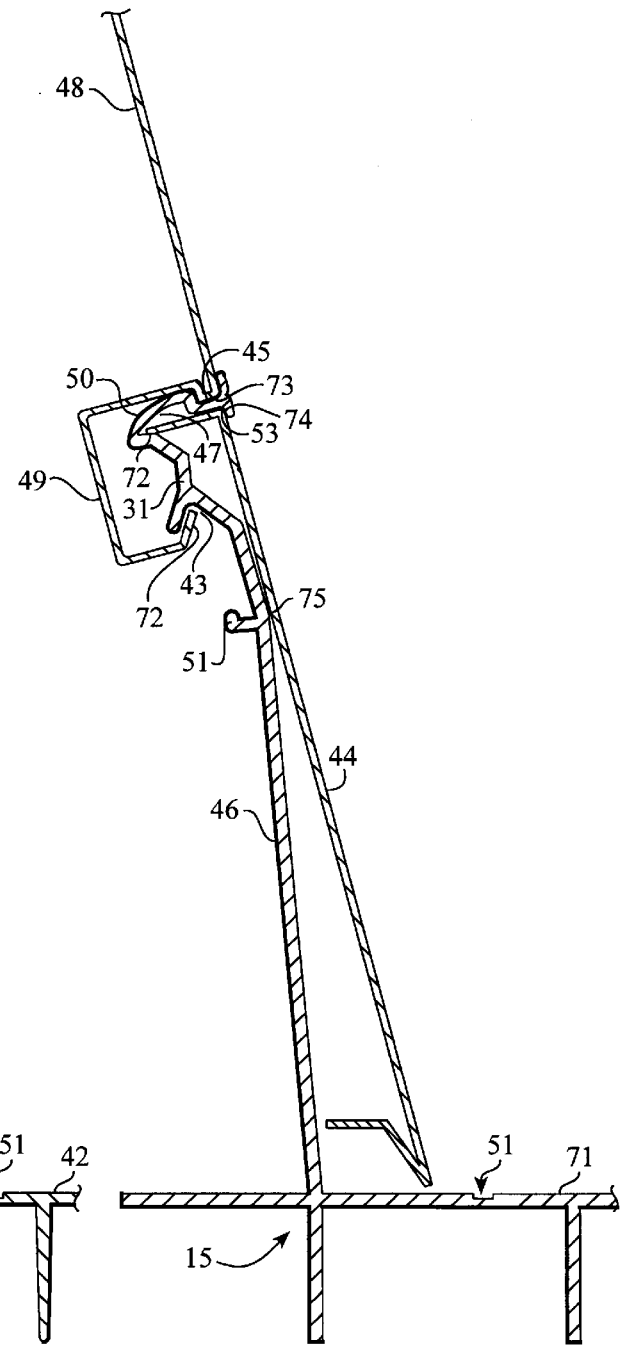
FIG. 4 is a side view of a second embodiment of a heat sink and wall member connection joint in accordance with the present invention.

FIGS. 3 and 4 show alternate embodiments of the clips used for the connection of the wall panels to the heat sink. In FIG. 3, heat sink 15 has a wing 36 with an upper end shaped as a clip 30. The upper wall panel 38 has a folded ridge 39 on its bottom edge 40 which is a right angle extension to the main panel body. The edge 40 inserts into a U-shaped cleft 37 formed in the clip 30 of wing 36. An upper lip 33 is formed in the bottom edge of the upper part of clip 30 so that it forms a latch in the cleft 37 in order to maintain the bottom edge 40 and the folded ridge 39 within the cleft 37. Similarly, the upper end of each lower reflector panel 34 has a folded ridge 35 on its upper edge 41 which is a right angle extension to the panel body engaging clip 30 in the cleft 37. The upper edge 41 is maintained in the cleft by a lower lip 32. The bottom edge of the lower reflector panel 34 stands off from the upper surface 42 of the base of heat sink 15 so that panel 34 is totally supported by clip 30. This is to avoid contact between the reflector panels and the solar cells mounted on upper surface 42.

Referring to FIG. 4, the upper panel member 48 has a folded ridge 49 which bends around the outer side of clip 31 of wing 46 and fits into two detents, an upper detent 45 and a lower detent 43, that are formed on the outer portion of the clip 31. A curved ramp 50 assists in seating an edge of folded ridge 49 in detent 45. The curved ramp has radii at both ends to assist in the seating of the outer ridge. The top edge of the reflector panel 44 connects into an inner slot 47 formed in the clip 31, while the bottom edge of the reflector panel 44 stands off from the upper surface 71 of the heat sink 15. The reflector 44 is held in place by an edge 74 on the clip 31 that captures the top corner 53 of the reflector 44. The reflector 44 is installed by snap action into the clip 31. The reflector 44 is held in proper position by three contact points 74, 75, and 76. An additional ridge 51 is formed in the clip 31, below the clip so that, if needed, a lever or other tool can be used for leverage to assist in inserting the upper panel member 48 into the detents 43 and 45 of the clip 31. The upper panel member 48 is joined to the clip 31 by first inserting the lip 72 into lower detent 43 and then rotating the upper panel member 48 so that edge 73 on the panel member 48 rides up on the curved ramp 50 and snaps into upper detent 45 of the clip 31. The upper panel member is held in place by clip 31 and the Fresnel lens.

As shown in FIG. 3, a plurality of heat exchanger fins 31 may be provided around the outside of the heat sink 15 in order to assist in the heat transfer process of the system. The fins 31 may be pre-formed into the base and wings of the heat sink, or the fins may be designed to be snapped on to the heat sink 15 such that fins of various lengths and geometries can be used in order to optimize heat transfer and material use. Shallow grooves 52 are placed in upper surface 42 of the bottom of the heat sink 15 to allow for clearing for the cell leads.

Figure 4A:
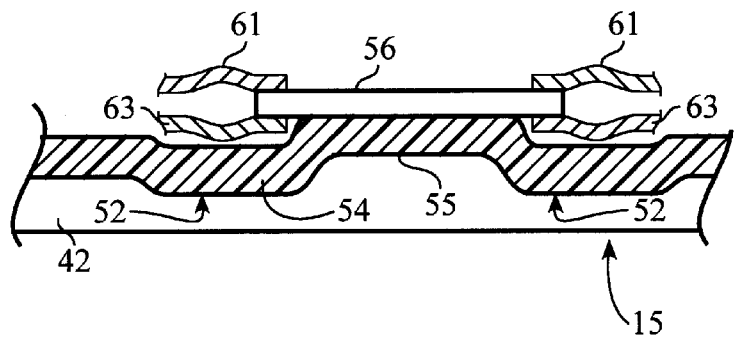
FIG. 4A is a side sectional view of a detail showing mounting of solar cells on the base of the heat sinks illustrated in FIGS. 3 and 4.

In FIG. 4A, upper surface 42 of the heat sink is seen having spaced apart grooves 52. A thin insulative layer 54 of a polymer, such as Kapton, a trademark for a thin polyamide resin in the form of film, separates the upper surface 42 from cells 56, which are linearly disposed on the land 55 between grooves 52. The cells 56 have a back contact on a back side and an active area on a front side, facing the Fresnel lens, with the front and back sides being in a photodiode relation. An electrical potential develops across the front and back of the cell, upon exposure to light, which is picked up by leads 61 for the front side potential and leads 63 for the back side potential. The largest electrical current exists with the greatest amount of light falling upon the cells and no electrical current exists when there is no light falling upon the cells.

Figure 5:
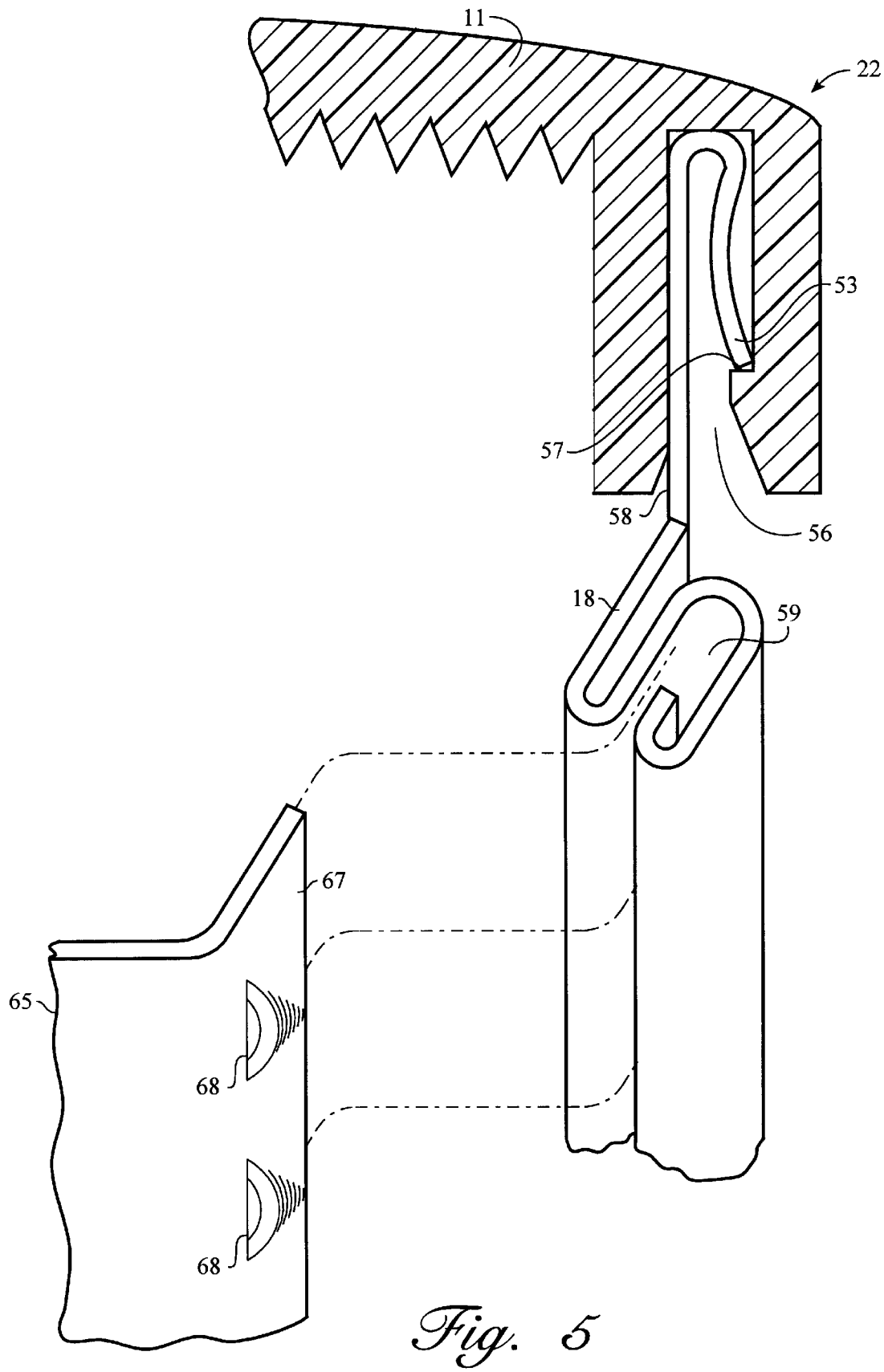
FIG. 5 is a side view of a first embodiment of a connection joint for a lens and wall member and of a first embodiment of a connection joint for an end cap joined to the wall member in accordance with the present invention.

In FIG. 5, the snap-fit upper joint 22 includes a U-shaped slot 56 that is formed in the outer edge of the lens 11. The joint 22 includes the top edge 58 of the upper wall panel 18 being inserted into the slot 56. A hair pin terminal 53 formed in the extremity of top edge 58 of the upper panel member wedges into the ledge 57 so that the top edge 58 of upper panel member 18 is secured to the lens 11. The top edge 58 also includes, at lengthwise ends, a snap fit joint 59 that is used for securement of the end cap 65. The end cap 65 has a flange 67 which extends the height of the end cap. Along the height of the flange 67 are a plurality of button locks 68 formed into the flange. The flange 67 of the end cap 65 inserts into a snap-joint 59 which is formed in the edge of the upper panel member 18 and the button locks 68 secure the end cap flange 67 in the snap-joint 59. As an alternative to the button locks, screws could be used to secure the end cap in place.

Figure 6:
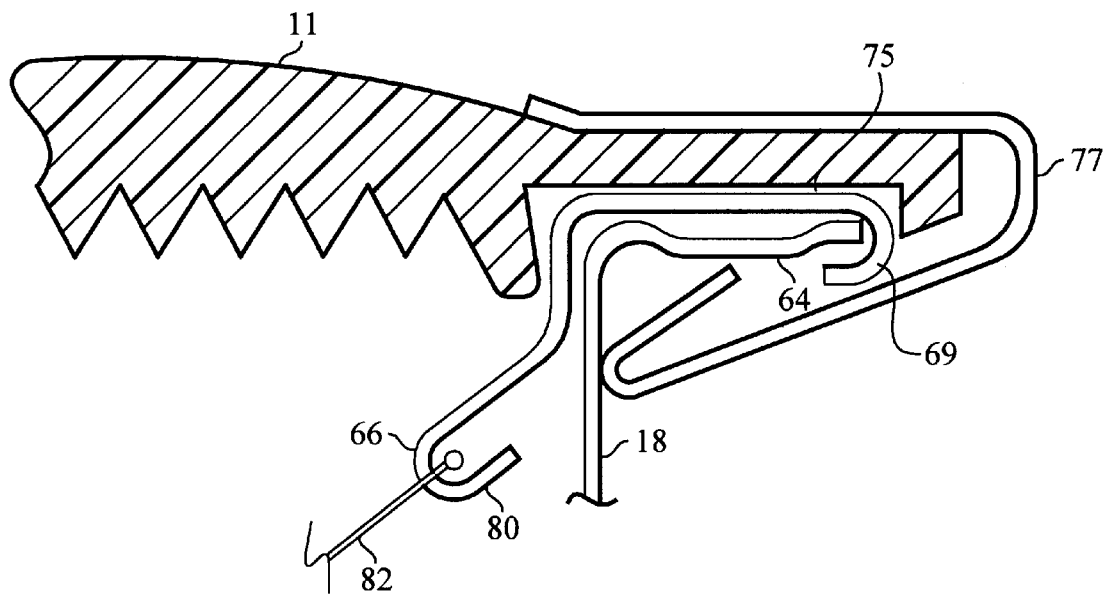
FIG. 6 is a side view of a second embodiment of a connection joint for a lens and wall member.

In FIG. 6, the lens 11 is connected to the upper panel member 18. In this embodiment, the upper panel member 18 bends transversely at a top edge 64, forming a horizontal portion. A clip 66 has a hook end 69 wrapping around the top edge 64 of panel member 18 and has an anchor end 80 which secures a tension wire 82. The clip 66 and top edge 64 fit into a tang or notch 75 formed in the outer edge of the lens 11. A retainer clip 77 is used to secure the several pieces to the lens 11. The clip 77 has a shape such that it bends around the tang 75 of the lens 11 and wedges against both the upright portion of the panel member 18 and the top edge 64 of the panel member. Tension wire 82 or other device prevents the lens 11 from spreading if it receives pressure from the wind or some other force. The tension wire 82 or other device is connected across the lens 11 from one upper panel member connection joint to the other upper panel member.

As can be seen from the above description, the solar energy conversion assembly of the present invention can be assembled without the need for specialized tools or factory equipment. The connections between the various parts of the solar energy conversion unit are designed for easy assembly, which allows for the parts to be shipped in flat boxes and assembled in the field.

What is claimed is:

1. A modular solar energy conversion unit for assembly comprising:

an elongated housing having opposed convergent wall members, each wall member having upper and lower reflector panels with co-extensive lengthwise extent, the lower panel being specularly reflective, the panels having edges with one edge of each panel being bent, the housing having distal ends with an end cap closing each end, a pair of linear clips engaging bent edges of each panel in opposed panels, a heat sink, with a base and upright wings supporting the linear clips, panel member, a curved Fresnel lens removably disposed between upper edges of the wall members with snap fasteners, and a plurality of solar cells disposed on the base of the heat sink in optical communication with said Fresnel lens, whereby wall members may clipped together and the Fresnel lens snapped to the wall members for an assembly of the unit.

2. The modular solar energy conversion unit of claim 1, wherein the linear clips are supported at ends of the wings of the heat sink and have a shape that includes a cleft on an inner side of the clips.

3. The modular solar energy conversion unit of claim 2, wherein the edge of the lower and upper reflective panels has a folded ridge which bends around the inner side of the clip and inserts into the cleft on the inner side of the clip.

4. The modular solar energy conversion unit of claim 2, wherein the clips have upper and lower detents on the outer side of each clip, with the edge of the upper reflective panels having a folded ridge which bends around the outer side of each clip and connects into the upper detent and the lower detent on the outer side of the heat sink.

5. The modular solar energy conversion unit of claim 2 wherein each lower reflective panel is disposed on the inner side of the wings of the heat sink and is connected to wings of the heat sink at the cleft.

6. The modular solar energy conversion unit of claim 1, wherein the upper edges of each of the upper reflective panels are connected to the Fresnel lens by a locking clip and are supported laterally by a tension wire.

7. The modular solar energy conversion unit of claim 1, wherein each of the end caps connect to the upper and lower panels by a snap-together joint.

8. The modular solar energy conversion unit of claim 1, wherein each of the end caps connect to the upper and lower panels by self tapping screws.

9. The modular solar energy conversion unit of claim 1, wherein the heat sink includes a plurality of fins formed around the outside of the heat sink.

10. The modular solar energy conversion unit of claim 1 wherein the solar cells are disposed on a web.

11. A solar energy conversion assembly consisting of a plurality of modular solar energy conversion units mounted on a mounting frame, each of the modular solar energy conversion units comprising:

an elongated housing having opposed convergent wall members having pairs of coplanar upper and lower reflective panels, the lower reflective panels being specularly reflective, with co-extensive upper and lower edges for each panel running a predetermined length, the housing having distal ends with an end cap closing each end, a heat sink with a base and upright wings extending from the base terminated by linear clips having means for engaging adjacent edges of the coplanar panels, and a base between the upright wings, a curved Fresnel lens disposed between upper edges of the wall members, and a plurality of solar cells disposed on the base of the heat sink in optical communications with said Fresnel lens.

12. The solar energy conversion assembly of claim 11, wherein the upper edges of each of the upper reflective panels are fastened to the Fresnel lens by a snap-together joint formed by a tang in the edge of the Fresnel lens, the upper edge of the wall members snap-fitting into the tang.

13. The solar energy conversion assembly of claim 11, wherein wings of the heat sink are connected to support the lower reflective panels in a stand off relation relative to the base of the heat sink.

14. The solar energy conversion assembly of claim 11, wherein the ends of the wings of the heat sink define the linear clips to have a shape that includes a cleft on an inner side of the clip ends.

15. The solar energy conversion assembly of claim 14, wherein the edges of the lower and upper reflective panels have a folded ridge which bends around the inner side of the clips and inserts into the cleft on the inner side of the clips.

16. The solar energy conversion assembly of claim 14, wherein the clips have upper and lower detents on the outer side of each clip, with the edge of the upper reflective panels having a folded ridge which bends around the outer side of the clip and connects into detents on the outer side of the heat sink.

17. The solar energy conversion assembly of claim 11, wherein each of the each of the end caps connect to the upper and lower panels by a snap-together joint.

18. The solar energy conversion assembly of claim 11, wherein the heat sink includes a plurality of fins formed around the outside of the heat sink.

19. In a collector for a solar energy conversion unit of type have elongated V-shaped opposed reflective walls, with solar cells disposed at the convergence of the walls and a lens spanning the walls opposite the solar cells and focussing light thereon, the improvement comprising, a wall construction with upper and lower elongated reflective panels connected together forming a wall, the upper panels being diffusely reflective and the lower panels being specularly reflective.

20. The apparatus of claim 19 wherein upper and lower elongated reflective panels are coplanar.

21. The apparatus of claim 19 wherein a heat sink with a base and upwardly extending opposed wings is disposed below the lower elongated reflective panels, the wings terminating in clips joining the upper and lower elongated reflective panels, the clips supported by the lower elongated reflective panels in a stand off relation relative to the base, with the upper and lower elongated reflective panels of opposed walls converging toward each other.

22. The apparatus of claim 21 wherein the clips have a cleft and the upper and lower elongated reflective panels each have an edge fitting into the cleft.

23. The apparatus of claim 21 wherein the clips have detents and one of the upper and lower elongated reflective panels has a ridge engaging the detents.

* * * * *